(12) United States Patent
Lee et al.

(10) Patent No.: US 9,723,188 B2
(45) Date of Patent: Aug. 1, 2017

(54) IMAGE SENSOR, METHOD OF MANUFACTURING THE IMAGE SENSOR, AND ELECTRONIC DEVICE INCLUDING THE IMAGE SENSOR

(71) Applicant: SK hynix Inc., Gyeonggi-do (KR)

(72) Inventors: Won-Jun Lee, Gyeonggi-do (KR); Kyoung-In Lee, Gyeonggi-do (KR); Cha-Young Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/821,475

(22) Filed: Aug. 7, 2015

(65) Prior Publication Data

US 2016/0073065 A1    Mar. 10, 2016

(30) Foreign Application Priority Data

Sep. 4, 2014   (KR) .......................... 10-2014-0117877
Jun. 9, 2015   (KR) .......................... 10-2015-0081003

(51) Int. Cl.
*H04N 5/225*    (2006.01)
*H04N 9/04*    (2006.01)
*H01L 27/146*    (2006.01)

(52) U.S. Cl.
CPC ..... *H04N 5/2254* (2013.01); *H01L 27/14627* (2013.01); *H01L 27/14685* (2013.01)

(58) Field of Classification Search
CPC  H04N 9/045; H04N 5/2254; H01L 27/14685; H01L 27/14627
See application file for complete search history.

(56) References Cited

U.S. PATENT DOCUMENTS

2012/0273907 A1* 11/2012 Lim .................. H01L 27/14621
                                                              257/432
2013/0001724 A1*  1/2013 Masuda ........... H01L 27/14623
                                                              257/432
2014/0306360 A1* 10/2014 Li ......................... B05D 1/005
                                                              264/1.7

* cited by examiner

*Primary Examiner* — Padma Haliyur
(74) *Attorney, Agent, or Firm* — IP & T Group LLP

(57) ABSTRACT

Provided are an image sensor, a method of manufacturing the image sensor, and an electronic device including the image sensor. An image sensor according to an embodiment may include a photoelectric conversion element, a pixel lens formed over the photoelectric conversion element and comprising a plurality of light condensing layers, wherein an upper layer of plurality of light condensing layers has a smaller area than a lower layer, and the pixel lens comprises a color filter substance.

18 Claims, 9 Drawing Sheets

IMAGE SENSOR, METHOD OF MANUFACTURING THE IMAGE SENSOR, AND ELECTRONIC DEVICE INCLUDING THE IMAGE SENSOR

CROSS-REFERENCE TO RELATED APPLICATIONS

The present application claims priority of Korean Patent Application Nos. 10-2014-0117877 and 10-2015-0081003 filed on Sep. 4, 2014 and Jun. 9, 2015, respectively, which are herein incorporated by reference in their entirety.

BACKGROUND

Exemplary embodiments of the present invention relate to a semiconductor device manufacturing technology, and more particularly, to an image sensor including a light condensing member having a multi-layer step shape, a method of manufacturing the image sensor, and an electronic device including the image sensor.

An image sensor converts an optical image into an electrical signal. Recently, due to the development of the computer industry and the communication industry, a demand for an image sensor with improved performance has increased for various devices, such as digital cameras, camcorders, PCS (Personal Communication System), game machines, security cameras, medical micro-cameras, and robots.

SUMMARY

Various embodiments are directed to an image sensor having improved performance, a method of manufacturing the image sensor, and an electronic device including the image sensor.

In an embodiment, an image sensor may include a photoelectric conversion element; and a pixel lens formed over the photoelectric conversion element and comprising a plurality of light condensing layers, wherein an upper layer of plurality of light condensing layers has a smaller area than a lower layer, and the pixel lens comprises a color filter substance.

Furthermore, the image sensor according to an embodiment may further include a focusing layer provided between the photoelectric conversion element and the pixel lens. The focusing layer may have a higher refractive index than the pixel lens. The focusing layer may have a greater area than the pixel lens. Furthermore, the image sensor according to an embodiment may further include an anti-reflection layer interposed between the photoelectric conversion element and the pixel lens or between the photoelectric conversion element and the focusing layer. Additionally, the image sensor according to an embodiment may further include a planarization layer covering the pixel lens and having a flat top surface, and a hemispherical lens formed over the planarization layer.

The pixel lens may have a multi-layer step shape. The pixel lens may have a single body structure, and wherein the plurality of light condensing layers may include the same color filter substance. A thickness of a bottommost layer of the plurality of light condensing layers may be proportional to a wavelength of color-separated incident light. A width of the lower layer exposed by the upper layer may be smaller than a wavelength of incident light. The plurality of light condensing layers of the pixel lens may be same as each other in shape and may be different from each other in size, and may be arranged in parallel to each other. A thickness of the upper layer may be the same as or smaller than a thickness of the lower layer. The plurality of light condensing layers of the pixel lens may have the same refractive index as each other.

In an embodiment, a method of manufacturing an image sensor may include forming a transfer layer comprising a color filter substance over a substrate, wherein a photoelectric conversion element has been formed in the substrate; preparing a stamp engraved with a multi-layer step pattern; transferring the multi-layer step pattern engraved in the stamp to the transfer layer by pressurizing the stamp against the transfer layer; and hardening the transfer layer to form a pixel lens, wherein the pixel lens has a multi-layer step shape and includes the plurality of light condensing layers, and wherein an upper layer of the plurality of light condensing layers has a smaller area than a lower layer.

In an embodiment, an electronic device may include an optical system; an image sensor suitable for receiving light from the optical system and outputting a specific signal in response to the received light; and a signal processing unit suitable for processing the signal output from the image sensor. The image sensor may include a photoelectric conversion element; and a pixel lens formed over the photoelectric conversion element and comprising a plurality of light condensing layers, wherein an upper layer of the plurality of light condensing layers has a smaller area than a lower layer, and the pixel lens comprises a color filter substance.

Furthermore, the electronic device according to an embodiment may further include a focusing layer provided between the photoelectric conversion element and the pixel lens. Furthermore, the electronic device according to an embodiment may further include an anti-reflection layer interposed between the photoelectric conversion element and the pixel lens or between the photoelectric conversion element and the focusing layer. Additionally, the electronic device according to an embodiment may further include a planarization layer covering the pixel lens and having a flat top surface; and a hemispherical lens formed over the planarization layer.

The pixel lens may have a multi-layer step shape. The pixel lens may have a single body structure, and wherein the plurality of light condensing layers may include the same color filter substance.

DETAILED DESCRIPTION

Figure 1:
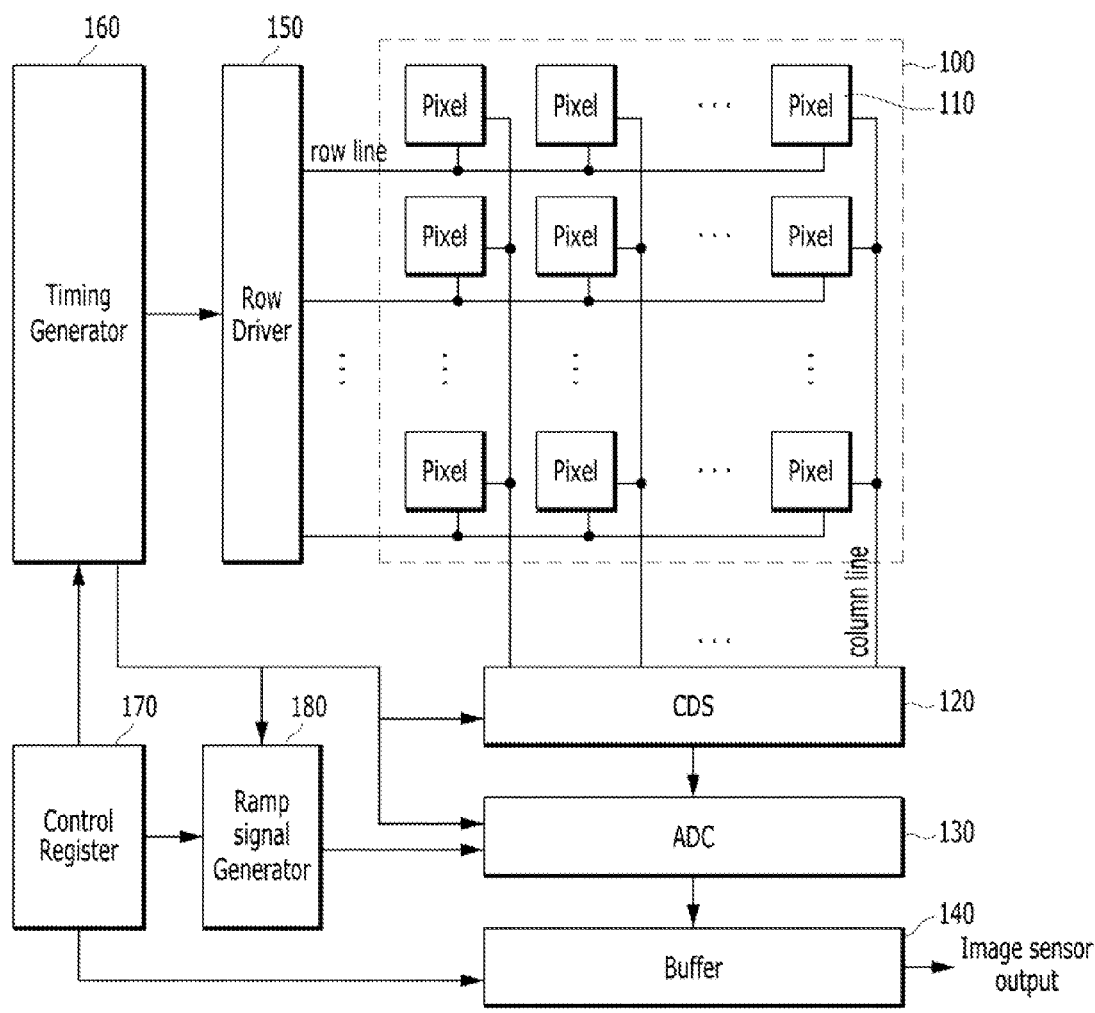
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The embodiments of the present invention provide an image sensor with improved performance and an electronic device having the same. When light condensing efficiency in unit pixels improves, performance of the image sensor improves accordingly. In general, an image sensor may include a plurality of unit pixels. Each of the unit pixels may include a semi-spherical type micro lens (ML) installed over a photoelectric conversion element. Through the micro lens, incident light may be condensed and transmitted into the photoelectric conversion element. The light condensing efficiency of the unit pixel may depend on quality of the micro lens. The light condensing efficiency may be controlled according to a focal distance between the micro lens and the photoelectric conversion element.

In a conventional micro lens, the focal distance between the micro lens and the photoelectric conversion element is likely to change during a process of changing the curvature of the micro lens. Thus, it is not easy to control the focal distance.

The micro lens may be formed through a process of reflowing a lens forming material, for example, resist. In such process, it is difficult to form a hemispherical shape with a desired curvature. Furthermore, since the micro lens is formed over a color filter layer, applicable materials are limited. In addition, the reflow process may require a high cost, may be formed only as a hemispherical shape, and may have difficulties in forming a micro lens with a symmetrical and uniform shape. This may increases crosstalk.

The following embodiments of the present invention provide an image sensor with improved light condensing efficiency in unit pixels and an electronic device having the same. For this structure, each of the unit pixels may include a pixel lens having a plurality of light condensing layers which are formed over a photoelectric conversion element. A lower layer of the plurality of light condensing layers has a larger area or critical dimension (CD) than an upper layer of the plurality of light condensing layers. Thus, the pixel lens may have a multilayer stepped structure. The pixel lens having a multilayer stepped structure exhibits sub-wavelength optics or sub-wavelength effects and can condense incident light as a hemispherical micro lens does. The pixel lens can effectively condense light within a limited area. Thus, the pixel lens according to an embodiment is advantageous in increasing integration of the image sensor and can easily control a focal distance. According to the sub-wavelength optics, an optical effect can be obtained in a spatial scale smaller than a half of a wavelength of incident light.

FIG. 1 is a black diagram schematically illustrating an image sensor in accordance with an embodiment of the present invention.

As illustrated in FIG. 1, the image sensor in accordance with the embodiment of the present invention may include a pixel array 100, a correlated double sampling (CDS) 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix shape.

The timing generator 160 may generate one or more control signals for controlling the row driver 150, the CDS 120, the ADC 130, and the ramp signal generator 180. The control register 170 may generate one or more control signals for controlling the ramp signal generator 180, the timing generator 160, and the buffer 140.

The row driver 150 may drive the pixel array 100 on a row line basis. For example, the row driver 150 may generate a select signal for selecting any one row line of a plurality of row lines. Each of the unit pixels 110 may sense incident light and output an image reset signal and an image signal to the CDS 120 through a column line. The CDS 120 may perform sampling on the image reset signal and the image signal.

The ADC 130 may compare a ramp signal outputted from the ramp signal generator 180 with a sampling signal outputted from the CDS 120 and output a comparison signal. According to a clock signal provided from the timing generator 160, the ADC 130 may count the level transition time of the comparison signal and output the count value to the buffer 140. The ramp signal generator 180 may be operated under control of the timing generator 160.

The buffer 140 may store a plurality of digital signals outputted from the ADC 130, and then sense and amplify the digital signals. Thus, the buffer 140 may include a memory (not illustrated) and a sense amplifier (not illustrated). The memory may serve to store count values. The count values are related to signals outputted from the plurality of unit pixels 110. The sense amplifier may serve to sense and amplify the count values outputted from the memory.

In the above-described image sensor, each of the unit pixels may include a pixel lens capable of improving light condensing efficiency. Hereinafter, a unit pixel including a pixel lens will be described in detail with reference to the accompanying drawings.

Figure 2:
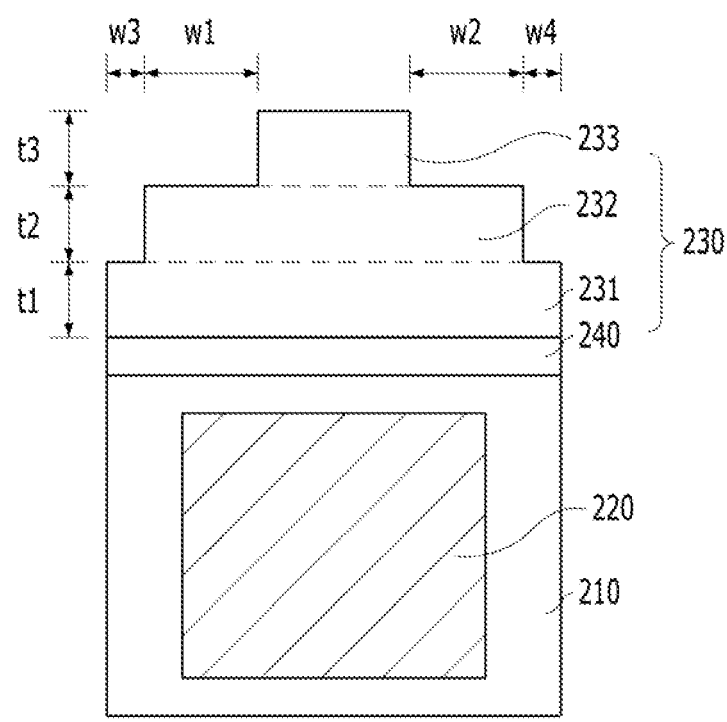
FIG. 2 is a diagram illustrating a unit pixel of an image sensor in accordance with a first embodiment of the present invention.
Figure 3:
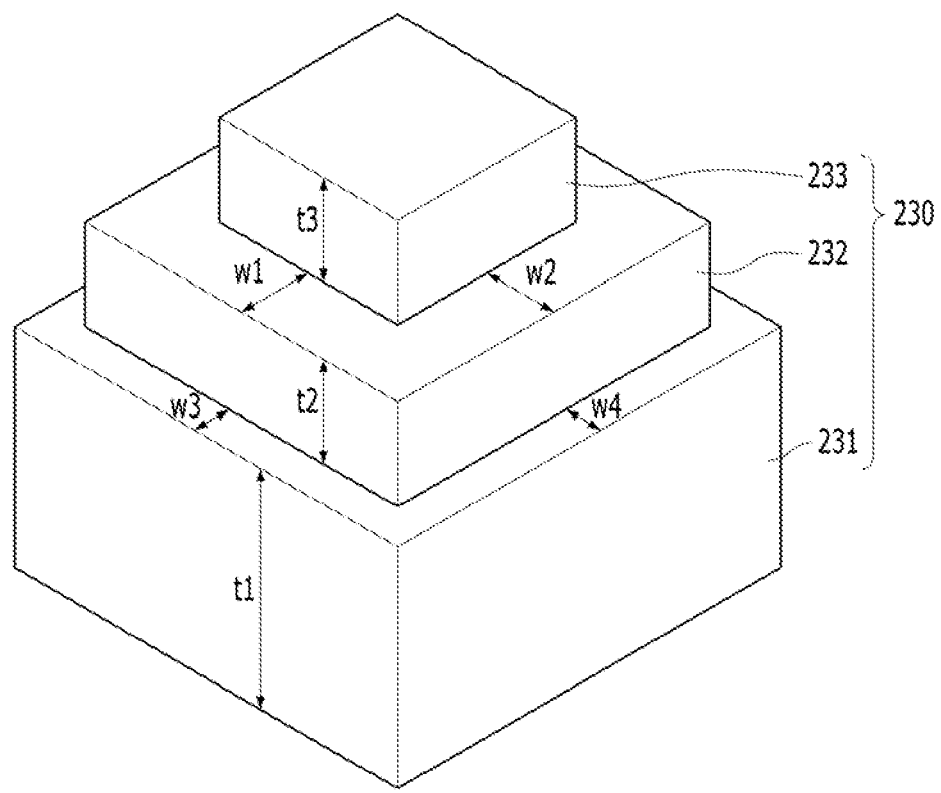
FIG. 3 is a perspective view illustrating a pixel lens in the unit pixel of the image sensor in accordance with the first embodiment.

FIG. 2 is a diagram illustrating a unit pixel of an image sensor in accordance with a first embodiment of the present invention, and FIG. 3 is a perspective view illustrating a pixel lens in the unit pixel of the image sensor in accordance with the first embodiment.

As illustrated in FIG. 2 and FIG. 3, the image sensor in accordance with the first embodiment may include a substrate 210 configured to include a photoelectric conversion element 220 formed to correspond to each of a plurality of unit pixels 110, a pixel lens 230 formed over the substrate 210, and an anti-reflection layer 240 interposed between the substrate 210 and the pixel lens 230. The pixel lens 230 overlaps with the photoelectric conversion element 220 and includes a plurality of light condensing layers 231, 232, and 233. In each of the light condensing layers 231, 232, and 233, an upper layer has a smaller area for width) than a lower layer. Each of the plurality of light condensing layers 231, 232, and 233 includes a color filter substance.

In the present embodiment, the first light condensing layer 231, the second light condensing layer 232, and the third light condensing layer 233 have been illustrated as being sequentially stacked to form the pixel lens 230. Specifically, the first light condensing layer 231 is the lowest light condensing layer, and the third light condensing layer 233 is the highest light condensing layer. The areas of the plurality of light condensing layers 231, 232, and 233 may be gradually reduced from the lowest light condensing layer to the highest light condensing layer.

The substrate 210 may include a semiconductor substrate. The semiconductor substrate may include a silicon-containing material. For example, the substrate 210 may include a single crystal silicon-containing material.

The photoelectric conversion element 220 may include photodiodes. For example, the photoelectric conversion element 220 formed in the substrate 210 may include a plurality of photoelectric conversion layers (not illustrated) that are vertically stacked. Each of the plurality of photoelectric conversion layers may be a photodiode including an N type impurity region and a P type impurity region.

The anti-reflection layer 240 functions to prevent diffused reflection between the pixel lens 230 and the substrate 210 having different refractive indices. The anti-reflection layer 240 may include a multiple layer in which two or more substance layers having different refractive indices are alternately stacked more than once.

The pixel lens 230 may function as a light condensing member for collecting incident light. To improve light condensing efficiency, the pixel lens 230 may have multiple layers formed by stacking two or more light condensing layers in which an upper layer has a smaller area or width than a lower layer. For example, the pixel lens 230 may have a multi-layer step shape. Since the pixel lens 230 has the multi-layer step shape, each of the widths W1, W2, W3, and W4 of the lower layers exposed by the upper layers may be smaller than the wavelength of incident light.

Specifically, each of the widths W1, W2 of the second light condensing layer 232 exposed by the third light condensing layer 233 and the widths W3, W4 of the first light condensing layer 231 exposed by the second light condensing layer 232 may be smaller than the wavelength of incident light. As described above, the width of a lower layer exposed by an upper layer in the pixel lens 230 having the multi-layer step shape is smaller than the wavelength of incident light. Accordingly, the pixel lens 230 having the multi-layer step shape may also collect light like a hemispherical lens 270 due to sub-wavelength optics. The widths W1, W2, and W3, W4 of the lower layers exposed by the upper layers in the pixel lens 230 may be the same as each other that is W1=W2, W3=W4 or may be different from each other that is, W1≠W2, W3≠W4. The plurality of light condensing layers 231, 232, and 233 may have the same shape, and the plurality of light condensing layers 231, 232, and 233 may be vertically stacked. The plurality of light condensing layers 231, 232, and 233 may be arranged in parallel to each other. The plurality of light condensing layers 231, 232, and 233 may be a circular shape, a polygonal shape including a quadrangular shape, or the like.

To further improve light condensing efficiency of the pixel lens 230, the thickness of the upper layer in the plurality of light condensing layers 231, 232, and 233 may be the same as or thinner than the thickness of the lower layer. Specifically, the thickness t3 of the third light condensing layer 233 may be the same as (t2=t3) or thinner than (t2>t3) the thickness t2 of the second light condensing layer 232. Furthermore, the thickness t2 of the second light condensing layer 232 may be the same as (t2=t1) or thinner than (t1>t2) the thickness t1 of the first light condensing layer 231. The pixel lens 230 and the plurality of light condensing layers 231, 232, and 233 may have the same refractive index.

The pixel lens 230 may function as a light condensing member for collecting incident light and also function as a color filter for performing color separation on incident light. To this end, the plurality of light condensing layers 231, 232, and 233 forming the pixel lens 230 may include color filter substances. The plurality of light condensing layers 231, 232, and 233 forming the pixel lens 230 may include the same color filter substance. Accordingly, the plurality of light condensing layers 231, 232, and 233 forming the pixel lens 230 may have a single body structure having a single color filter substance.

For the effective color separation of incident light, the first light condensing layer 231, that is, the lowest layer light condensing layer of the pixel lens 230, may have a form that covers the entire unit pixel 110, that is, an area corresponding to the unit pixel 110.

The thickness t1 of the lowest light condensing layer of the pixel lens 230 may be adjusted depending on the wavelength of color-separated incident light by taking into consideration a focal distance according to chromatic aberration for each color. That is, as the wavelength of color-separated incident light increases, the thickness t1 of the first light condensing layer 231 may also increase.

For example, when the pixel lens 230 includes a green filter substance and the pixel lens 230 includes a blue filter substance, the thickness t1 of the first light condensing layer 231 including the green filter substance may be thinner than the thickness t1 of the first light condensing layer 231 including the blue filter substance. The thickness t1 of the first light condensing layer 231 including the green filter substance may be thicker than the thickness t1 of the first light condensing layer 231 including red filter substance. For reference, the focal distance means the distance in which incident light collected by the pixel lens 230 reaches the photoelectric conversion element 220.

The image sensor in accordance with the first embodiment can improve light condensing efficiency in the unit pixel 110 since it includes the pixel lens 230 having the multi-layer step shape.

Furthermore, since the pixel lens 230 functions as a color filter, light condensing efficiency in the unit pixel 110 can be further improved, and the size or height of the image sensor can also be reduced.

Quantum efficiency in the photoelectric conversion element 220 can also be improved since light condensing efficiency in the unit pixel 110 is improved as described above. As a result, performance of the image sensor can be improved.

Figure 4:
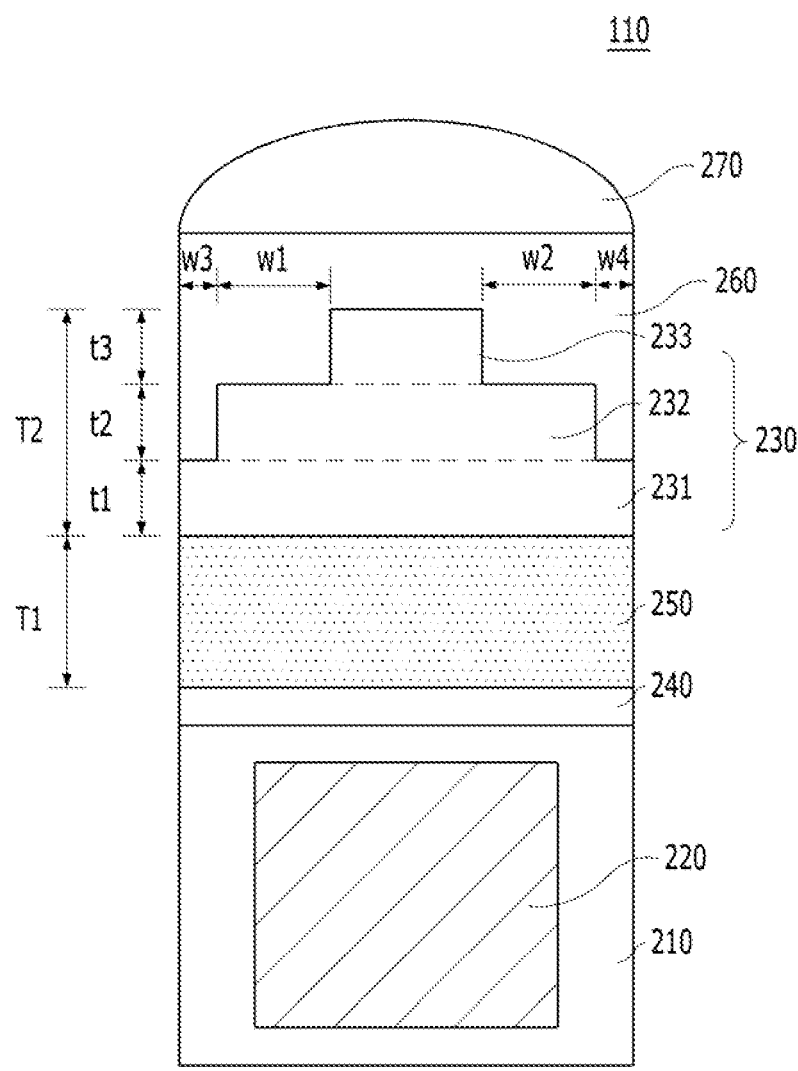
FIG. 4 is a diagram illustrating a unit pixel of an image sensor in accordance with a second embodiment of the present invention.

FIG. 4 is a diagram illustrating a unit pixel of an image sensor in accordance with a second embodiment of the present invention. In the present embodiment, the same elements as those of the first embodiment are assigned the same reference numerals as those of the first embodiment, and a detailed description thereof is omitted.

As illustrated in FIG. 4, the image sensor in accordance with a second embodiment may include a substrate 210 configured to include a photoelectric conversion element 220 formed in such a way as to correspond to each of a plurality of unit pixels 110, a focusing layer 250 formed over the substrate 210, an anti-reflection layer 240 interposed between the substrate 210 and the focusing layer 250, a pixel lens 230 formed on the focusing layer 250 in such a way as to overlap with the photoelectric conversion element 220 and configured to include a plurality of light condensing layers 231, 232, and 233 in which an upper layer has a smaller area or width than a lower layer and each of which includes a color filter substance, a planarization layer 260 configured to cover the pixel lens 230 and to have a flat top surface, and a hemispherical lens 270 formed on the planarization layer 260. In the present embodiment, the first light condensing layer 231, the second light condensing layer 232, and the third light condensing layer 233 have been illustrated as being sequentially stacked as the pixel lens 230 in which the plurality of light condensing layers 231, 232, and 233 has been stacked.

Specifically, the first light condensing layer 231 is the lowest light condensing layer, and the third light condensing layer 233 is the highest light condensing layer. The areas of the plurality of light condensing layers 231, 232, and 233 may be gradually reduced from the lowest light condensing layer to the highest light condensing layer. For reference, the substrate 210, photoelectric conversion element 220, anti-reflection layer 240, and pixel lens 230 of the second embodiment are the same as those of the first embodiment, and thus a detailed description thereof is omitted.

The focusing layer 250 functions to control the distance in which incident light collected through the pixel lens 230 reaches the photoelectric conversion element 220, that is, a focal distance. A focal distance may be shorter than the focal distance of a conventional micro lens since the focusing layer 250 is included. In this case, the focal distance may be controlled by controlling the thickness T1 of the focusing layer 250 according to the thickness T2 of the pixel lens 230. For example, if the thickness T1 of the focusing layer 250 becomes smaller than the thickness T2 of the pixel lens 230, the focal distance may become shorter (T1<T2). If the thickness T1 of the focusing layer 250 becomes greater than the thickness T2 of the pixel lens 230, the focal distance may become longer (T1>T2).

To effectively transfer incident light collected through the pixel lens 230 to the photoelectric conversion element 220, the focusing layer 250 may have a greater area than the pixel lens 230. The focusing layer 250 may have a shape corresponding to each of the unit pixels 110. Accordingly, the focusing layer 250 may have the same area as the lowest layer light condensing layer of the pixel lens 230, that is, the first light condensing layer 231. The focusing layer 250 may be formed at the same level as a focusing layer 250 of a neighboring unit pixel 110. For example, the focusing layer 250 may be a quadrangle.

To transfer incident light collected through the pixel lens 230 to the photoelectric conversion element 220 more effectively, the focusing layer 250 may have a higher refractive index than the pixel lens 230. Any transparent substance having a higher refractive index than the pixel lens 230 may serve as the focusing layer 250. The focusing layer 250 may have a single layer or may have multiple layers in which transparent substances having different refractive indices have been stacked. If the focusing layer 250 has a multiple-layer structure, the refractive index of the focusing layer 250 may have a slope. The refractive index of the focusing layer 250 may be increased as the focusing layer 250 becomes close to the photoelectric conversion element 220 or becomes distant from the pixel lens 230.

The hemispherical lens 270 may function to prevent the reflection of incident light and also direct incident light toward the pixel lens 230. The planarization layer 260 is for forming the hemispherical lens 270 on the pixel lens 230 having a multi-layer step shape and may be formed through a low-temperature process to prevent damage to the pixel lens 230. For example, the planarization layer 260 may include an ultra-low temperature oxide (ULTO) layer.

The image sensor in accordance with the second embodiment can improve light condensing efficiency in the unit pixel 110 since it includes the pixel lens 230 having the multi-layer step shape. Furthermore, since the pixel lens 230 functions as a color filter, light condensing efficiency in the unit pixel 110 can be further improved and the size or height of the image sensor can be reduced.

Furthermore, light condensing efficiency in the unit pixel 110 can be improved more effectively due to the image sensor including the focusing layer 250 and the hemispherical lens. Quantum efficiency in the photoelectric conversion element 220 can also be improved because light condensing efficiency in the unit pixel 110 is improved as described above. As a result, performance of the image sensor can be improved.

A method of manufacturing the image sensor in accordance with the aforementioned embodiments of the present invention is described below. In the image sensor according to the embodiments of the present invention, the pixel lens may include a color filter substance. Thus, no additional color filter is necessary. The plurality of light condensing layers forming the pixel lens may have a single body structure including a single color filter substance. Accordingly, in the following method, a method of forming the pixel lens through an imprinting process has been illustrated.

FIGS. 5A to 5D are cross-sectional views illustrating a method of manufacturing the image sensor in accordance with an embodiment of the present invention. In the present embodiment, a method of manufacturing the image sensor of FIG. 2 is illustrated below.

Figure 5A:
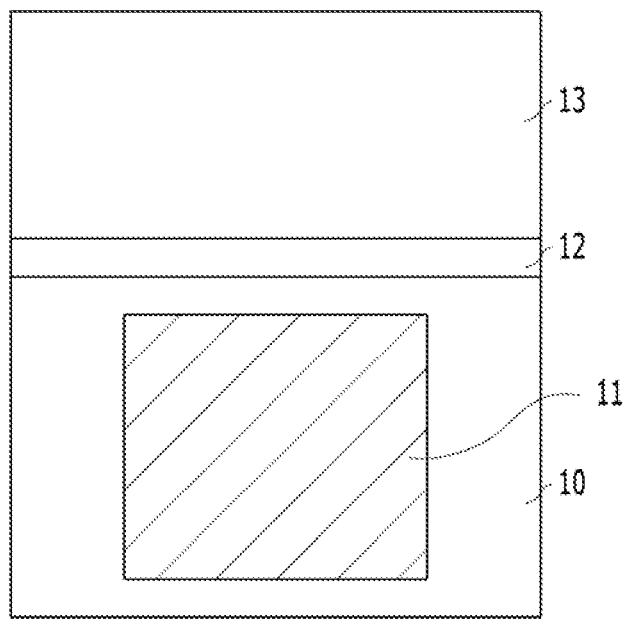
FIGS. 5A to 5D are cross-sectional views illustrating a method of manufacturing the image sensor in accordance with an embodiment of the present invention.

As illustrated in FIG. 5A, a photoelectric conversion element 11 is formed in a substrate 10. The substrate 10 may include a single crystal silicon-containing material. The photoelectric conversion element 11 may include photodiodes. The photoelectric conversion element 11 may include a plurality of photoelectric conversion layers (not illustrated) that are vertically stacked. Each of the plurality of photoelectric conversion layers may include an N type impurity region and a P type impurity region. The N type impurity region and the P type impurity region may be formed through an ion it plantation process.

An anti-reflection layer 12 is formed on the substrate 10. The anti-reflection layer 12 may be formed by alternately stacking two or more substance layers having different refractive indices, more than once.

A transfer layer 13 is formed on the anti-reflection layer 12. The transfer layer 13 may include a color filter substance. The color filter substance used as the transfer layer 13 may be based on a thermoplastic polymer material, for example, polymethly methacrylate (PMMA) or may be based on a material that generates a polymerization reaction by ultraviolet rays, for example, resin.

Figure 5B:
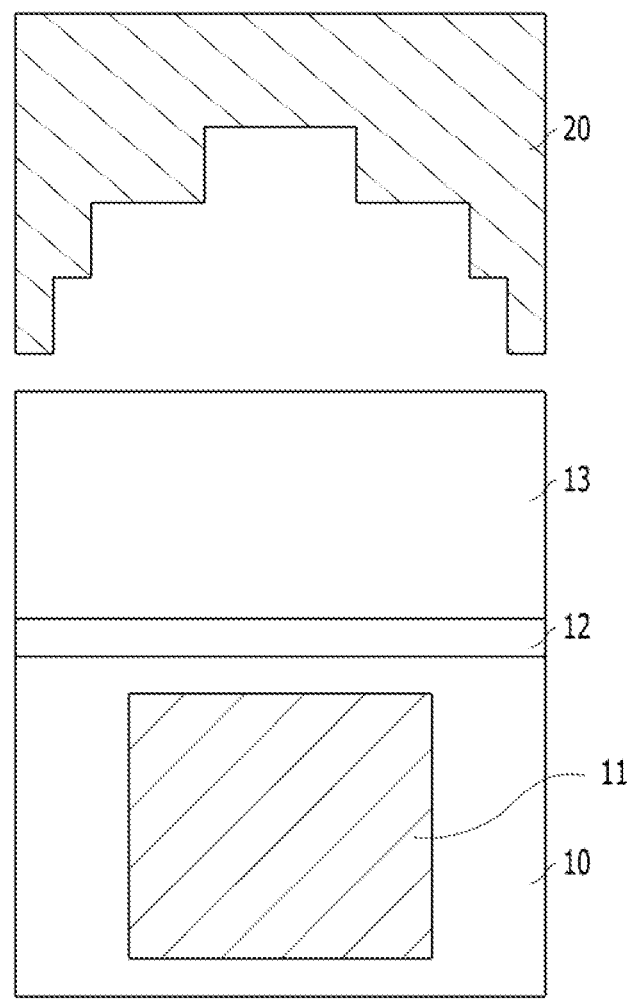

As illustrated in FIG. 5B, a stamp 20 is prepared. The stamp 20 is engraved with a pixel lens 14. The stamp 20 is also called a mode, and may be formed using a semiconductor material such as silicon or silicon oxide, a metal material such as nickel (Ni), a light-transparent material such as quartz, pyrex, soda lime glass, alumina, and sapphire, and a plastic material.

Next, the stamps 20 are applied to the substrate 10 in which the transfer layer 13 has been formed.

Figure 5C:
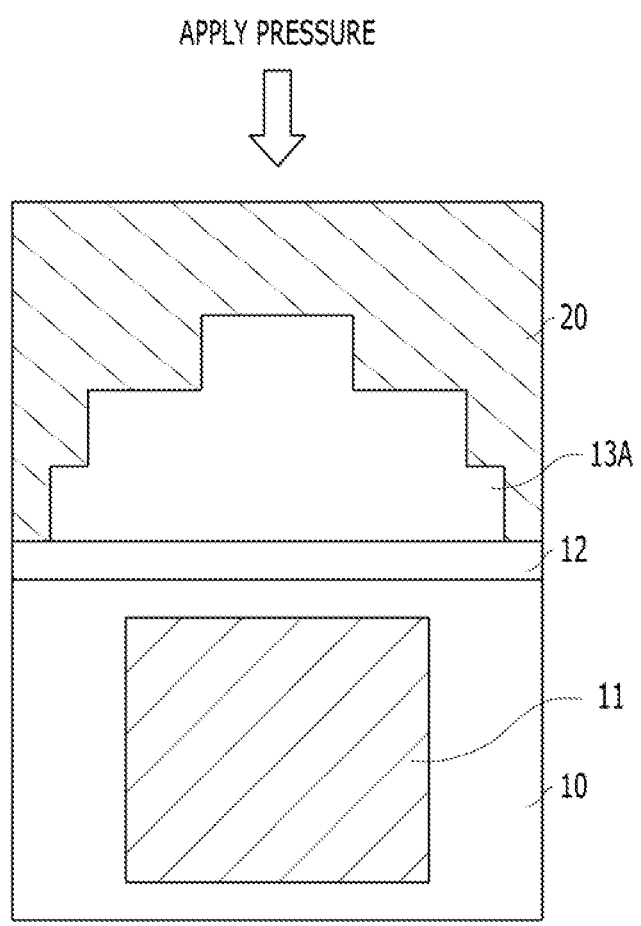

As illustrated in FIG. 5C, a pattern engraved in the stamp 20 is transferred to the transfer layer 13A by pressurizing the stamp 20 against the transfer layer 13. The transfer layer 13A may include a thermoplastic polymer material, and the carved transfer layer 13A may be hardened by thermal treatment. In another embodiment, the transfer layer 13A is subject to polymerization upon exposure to ultraviolet rays, and the carved transfer layer 13A may be hardened by radiating ultraviolet rays.

Figure 5D:
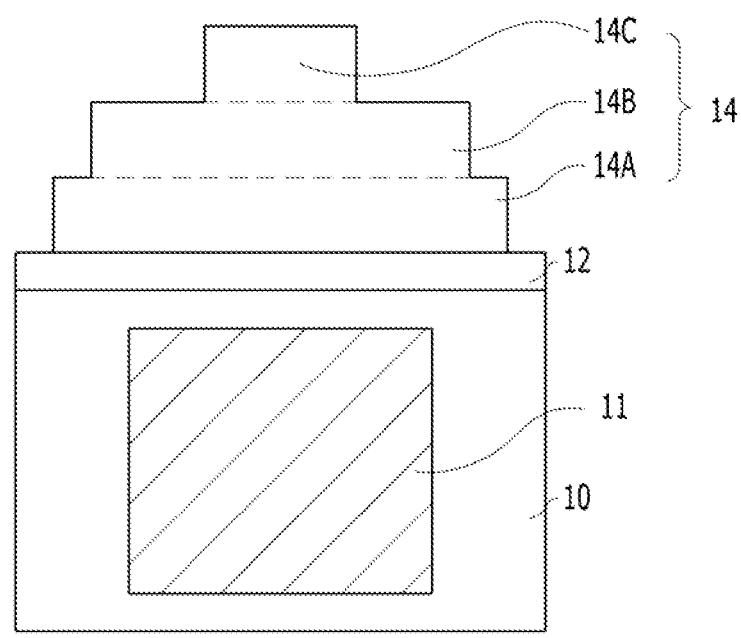

As illustrated in FIG. 5D, after the carved transfer layer 13A is hardened, the stamp 20 is removed. Post-treatment for removing residues remaining on a surface of the transfer layer 13A is performed. The post-treatment may be performed using a blanket etch process, oxygen plasma processing, a cleaning process, or a combination thereof.

Accordingly, the pixel lens 14 is formed over the substrate 10, overlaps with the photoelectric conversion element 11, is configured to include a plurality of light condensing layers 14A, 14B, 14C, and includes the color filter substance. An upper layer of the plurality of light condensing layers 14A, 14B, 14C has an area or width smaller than a lower layer.

The image sensor in accordance with an embodiment of the present invention may be used in various electronic devices or systems. Hereafter, the image sensor in accordance with an embodiment of the present invention which is applied to a camera will be described with reference to FIG. 6.

Figure 6:
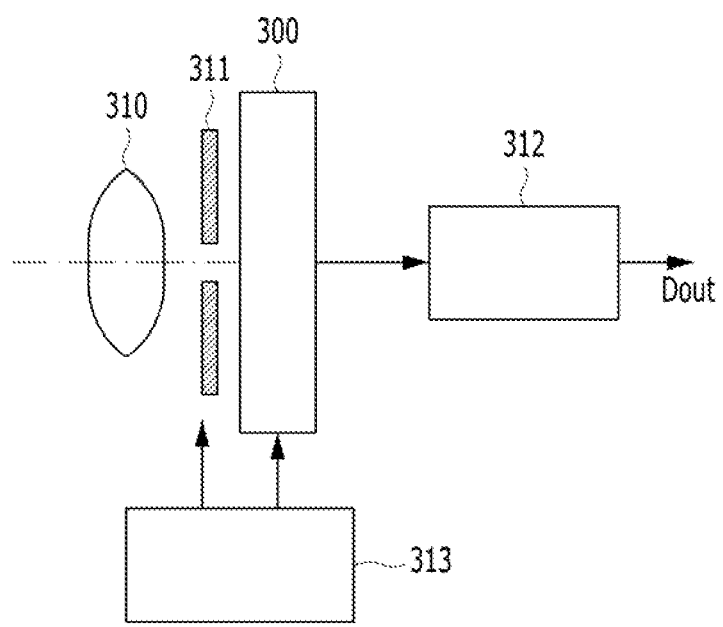
FIG. 6 is a diagram illustrating an electronic device including an image sensor in accordance with an embodiment of the present invention.

FIG. 6 is a diagram briefly illustrating an electronic device including an image sensor in accordance with an embodiment of the present invention. Referring to FIG. 6, the electronic device including the image sensor in accordance with an embodiment of the present invention may include a camera capable of taking a still image or moving image. The electronic device may include an optical system or optical lens 310, a shutter unit 311, a driving unit 313 for controlling/driving the image sensor 300 and the shutter unit 311, and a signal processing unit 312.

The optical system 310 may guide image light that is, incident light, from an object to the pixel array 100 (refer to FIG. 1) of the image sensor 300. The optical system 310 may include a plurality of optical lenses. The shutter unit 311 may control a light exposure period and a light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals bout may be stored in a storage medium such as a memory or outputted to a monitor or the like.

This technology can improve light condensing efficiency in a unit pixel because the pixel lens having the multi-layer step shape is included. Furthermore, since the pixel lens functions as a color filter, light condensing efficiency in a unit pixel can be further improved, and the size or height of the image sensor can be reduced. Quantum efficiency in the photoelectric conversion element can also be improved because light condensing efficiency in a unit pixel is improved as described above. As a result, performance of the image sensor can be improved.

Although various embodiments have been described for illustrative purposes, it will be apparent to those skilled in the art that various changes and modifications may be made without departing from the spirit and scope of the invention as defined in the following claims.

What is claimed is:

1. An image sensor, comprising:
a photoelectric conversion element;
a pixel lens formed over the photoelectric conversion element and comprising a plurality of light condensing layers; and
a focusing layer provided between the photoelectric conversion element and the pixel lens, wherein the focusing layer has a higher refractive index than the pixel lens,
wherein an upper layer of the plurality of light condensing layers has a smaller area than a lower layer,
wherein each of the plurality of light condensing layers of the pixel lens comprises a color filter substance and has a flat surface, and
wherein a width of the lower layer exposed by the upper layer is smaller than a wavelength of incident light.

2. The image sensor of claim 1, wherein the focusing layer has a greater area than the pixel lens.

3. The image sensor of claim 1, further comprising:
an anti-reflection layer interposed between the photoelectric conversion element and the pixel lens or between the photoelectric conversion element and the focusing layer.

4. The image sensor of claim 1, further comprising:
a planarization layer covering the pixel lens and having a flat top surface; and
a hemispherical lens formed over the planarization layer.

5. The image sensor of claim 1, wherein the pixel lens has a multi-layer step shape.

6. The image sensor of claim 1, wherein the pixel lens has a single body structure, and
wherein the plurality of light condensing layers include the same color filter substance.

7. The image sensor of claim 1,
wherein a thickness of a bottommost layer of the plurality of light condensing layers is proportional to a wavelength of color-separated incident light.

8. The image sensor of claim 1, wherein the plurality of light condensing layers of the pixel lens are same as each other in shape and are different from each other in size, and are arranged in parallel to each other.

9. The image sensor of claim 1, wherein a thickness of the upper layer is the same as or smaller than a thickness of the lower layer.

10. The image sensor of claim 1, wherein the plurality of light condensing layers of the pixel lens has the same refractive index as each other.

11. A method of manufacturing an image sensor, comprising:
forming a transfer layer comprising a color filter substance over a substrate, wherein a photoelectric conversion element has been formed in the substrate;
preparing a stamp engraved with a multi-layer step pattern;
transferring the multi-layer step pattern engraved in the stamp to the transfer layer by pressurizing the stamp against the transfer layer; and
hardening the transfer layer to form a pixel lens, wherein the pixel lens has a multi-layer step shape and includes the plurality of light condensing layers, and
wherein an upper layer of the plurality of light condensing layers has a smaller area than a lower layer.

12. An electronic device, comprising:
an optical system;
an image sensor suitable for receiving light from the optical system and outputting a specific signal in response to the received light; and
a signal processing unit suitable for processing the signal output from the image sensor,
wherein the image sensor comprises;
a photoelectric conversion element;

a pixel lens formed over the photoelectric conversion element and comprising a plurality of light condensing layers; and a focusing layer provided between the photoelectric conversion element and the pixel lens, wherein the focusing layer has a higher refractive index than the pixel lens, wherein an upper layer of the plurality of light condensing layers has a smaller area than a lower layer, wherein each of the plurality of light condensing layers of the pixel lens comprises a color filter substance and has a flat surface, and wherein a width of the lower layer exposed by the upper layer is smaller than a wavelength of incident light.

13. The electronic device of claim 12, further comprising:
an anti-reflection layer interposed between the photoelectric conversion element and the pixel lens or between the photoelectric conversion element and the focusing layer.

14. The electronic device of claim 12, further comprising:
a planarization layer covering the pixel lens and having a flat top surface; and
a hemispherical lens formed over the planarization layer.

15. The electronic device of claim 12, wherein the pixel lens has a multi-layer step shape.

16. The electronic device of claim 12, wherein the pixel lens has a single body structure, and
wherein the plurality of light condensing layers include the same color filter substance.

17. An image sensor comprising:
a photoelectric conversion element;
a pixel lens formed over the photoelectric conversion element and comprising a plurality of light condensing layers; and
a focusing layer provided between the photoelectric conversion element and the pixel lens, wherein the focusing layer has a greater area than the pixel lens, wherein an upper layer of the plurality of light condensing layers has a smaller area than a lower layer, wherein each of the plurality of light condensing layers of the pixel lens comprises a color filter substance and has a flat surface, and wherein a width of the lower layer exposed by the upper layer is smaller than a wavelength of incident light.

18. The image sensor of claim 17, wherein the focusing layer has the same area as a lowest layer of the plurality of light condensing layers.

* * * * *